United States Patent [19]
Evans, Jr.

[11] Patent Number: 6,121,648
[45] Date of Patent: Sep. 19, 2000

[54] FERROELECTRIC BASED MEMORY DEVICES UTILIZING HYDROGEN GETTERS AND RECOVERY ANNEALING

[75] Inventor: Joseph T. Evans, Jr., Albuquerque, N. Mex.

[73] Assignee: Radiant Technologies, Inc, Albuquerque, N. Mex.

[21] Appl. No.: 09/318,405

[22] Filed: May 25, 1999

Related U.S. Application Data

[63] Continuation-in-part of application No. 09/282,309, Mar. 31, 1999.
[51] Int. Cl.[7] .............................. H01L 29/76; H01G 7/02
[52] U.S. Cl. .......................... 257/295; 257/310; 257/303
[58] Field of Search ..................................... 257/295, 303; 438/3, 240; 25/310

[56] References Cited

U.S. PATENT DOCUMENTS

| | | | |
|---|---|---|---|
| 5,541,807 | 7/1996 | Evans ........................................ | 257/295 |
| 5,578,867 | 11/1996 | Argos et al. ............................. | 257/632 |
| 5,760,433 | 6/1998 | Ramer et al. ........................... | 257/295 |

*Primary Examiner*—Tom Thomas
*Assistant Examiner*—Shouxiang Hu
*Attorney, Agent, or Firm*—Calvin B. Ward

[57] ABSTRACT

A ferroelectric memory cell for storing information and a method for fabricating the same. The information is stored in the remnant polarization of a ferroelectric dielectric layer by setting the direction of the remnant polarization. The ferroelectric memory cell is designed to store the information at a temperature less than a first temperature. During the fabrication process, the memory cell is subjected to an annealing operation in the presence of hydrogen at a second temperature and a packaging operation at a third temperature. The memory cell includes top and bottom contacts that sandwich the dielectric layer which includes a ferroelectric material having a Curie point greater than the first temperature and less than the second and third temperatures. The dielectric layer is encapsulated in an oxygen impermeable material such that the encapsulating layer prevents oxygen from entering or leaving the dielectric layer. The memory also includes a hydrogen barrier layer that inhibits the flow of hydrogen to the top and bottom electrodes when the memory cell is placed in a gaseous environment containing hydrogen. In one embodiment of the invention, a hydrogen-absorbing layer is constructed from a ferroelectric material having a Curie point of less than the second temperature but greater than the third temperature. An annealing operation at a temperature above the second and third temperature is utilized to reverse the damage resulting from the annealing operation in the presence of oxygen.

10 Claims, 5 Drawing Sheets

FERROELECTRIC BASED MEMORY DEVICES UTILIZING HYDROGEN GETTERS AND RECOVERY ANNEALING

RELATED APPLICATIONS

This application is a continuation-in-part of U.S. patent application Ser. No. 09/282,309, filed Mar. 31, 1999.

FIELD OF THE INVENTION

The present invention relates to ferroelectric based memory devices, and more particularly, to an improved ferroelectric capacitor and ferroelectric FET for use in memory systems.

BACKGROUND OF THE INVENTION

Computer memories may be conveniently classified in terms of whether or not the memory retains the information stored therein when power is removed from the memory. Conventional DRAMs and SRAMs are examples of memories that lose their contents when power is removed. EEPROM and flash RAM are examples of non-volatile memories. The cost of non-volatile memories per bit remains sufficiently high to discourage their use in many applications. In addition, the underlying memory structures may only be written a relatively small number of times compared to volatile memories. For example, an EEPROM memory cell can only be written approximately $10^4$ times. In addition, the time required to write data into an EEPROM is much longer than that required to write volatile memories. Hence, EEPROM cells have a relatively limited class of applications.

One class of non-volatile memory device stores information by altering the direction of polarization of a ferroelectric dielectric layer within the device. These devices are structurally similar to capacitors in which the dielectric layer is replaced by a ferroelectric material. In fact, one class of devices is structurally a capacitor in which the dielectric layer is replaced by a ferroelectric layer. In these devices, the ferroelectric dielectric may be polarized in one of two directions. The direction of polarization is used to store information, a "1" corresponding to one direction of polarization and a "0" corresponding to the other direction of polarization. The polarization of the dielectric is maintained when power is removed from the system, thus providing non-volatile operation.

The direction of the polarization may be sensed by applying a potential sufficient to switch the polarization across the capacitor. For the purposes of this discussion, assume that the applied potential difference is such that it would switch the dielectric to the polarization state corresponding to a "1". If the capacitor was polarized such that it stored a "1" prior to the application of the read potential, the polarization will not be altered by the read voltage. However, if the capacitor was polarized such that it stored a "0" prior to the application of the read potential, the polarization direction will switch. This switching will give rise to a current that flows from one plate of the capacitor to the other. A sense amplifier measures the current that flows in response to the read potential to determine the state of the capacitor. Once the capacitor has been read, the data must be rewritten in the capacitor if the read potential caused the state of the capacitor to switch.

A ferroelectric capacitor is normally constructed by depositing a layer of the ferroelectric material on a bottom electrode and then depositing a top electrode on the ferroelectric layer. Ferroelectric layers based on PZT are well known to those skilled in the art. These materials are heated to relatively high temperatures after deposition to provide a perovskite structure having the desired ferroelectric properties. After the annealing process, the dielectric film contains a large number of domains. Each individual domain has a spontaneous polarization equivalent to that of a monodomain single crystal of the perovskite material. At the end of the deposition process, domains are usually randomly oriented.

While this type of memory has been known to the art for some time, commercial realizations of this type of memory have been limited because of two problems, commonly referred to as "imprint" and "fatigue". Imprint is the tendency of a ferroelectric capacitor to exhibit a shift of its hysteresis curve along the voltage axis in either the positive or negative direction depending on the data stored therein. This tendency can lead to a logic state failure for either of two reasons. First, after a sufficient shift, both logic states appear the same to a sense amplifier. Second, the coercive voltage becomes too large to be switched by the available programming voltage. When either case is encountered, a memory cell based on the capacitor becomes useless.

Fatigue is the decrease in the magnitude of the remnant polarization of the dielectric layer with the number of times the direction of polarization is changed. Since the amount of charge displaced when the capacitor is switched is related to the remnant polarization, the capacitor finally reaches a point at which there is insufficient charge displaced to detect. At this point, a memory cell based on the capacitor also becomes useless.

Memory devices based on ferroelectric FETs are also known to the art. These structures may be viewed as a capacitor in which the top electrode has been replaced by a layer of semiconductor material having two electrodes deposited thereon and spaced apart from each other. Data is once again stored in the direction of polarization of the ferroelectric dielectric layer. The state of polarization gives rise to an electric field, which alters the resistivity of the semiconductor layer. That is, the resistance measured between the two electrodes depends on the direction of polarization of the ferroelectric layer. This class of devices has the advantage of not requiring the ferroelectric layer to be switched each time the device is read.

Memories based on prior art ferroelectric FETs exhibit retention problems which limit the usefulness of such devices. If data is not periodically rewritten, the data is lost. Prior art ferroelectric FET memories also exhibit fatigue problems.

To simplify the following discussion, the term ferroelectric memory cell will be defined to include both ferroelectric FETs and ferroelectric capacitors. As noted above, these devices may be viewed as differing in the manner in which the top electrode of a capacitor is constructed.

While more or less ideal ferroelectric memory cells can be demonstrated in the laboratory, attempts to incorporate these cells into packaged memory chips have failed to provide satisfactory parts. In general, a memory chip includes circuitry constructed on a silicon substrate utilizing conventional CMOS fabrication techniques. The CMOS circuitry provides the isolation transistors, sense amplifiers, and decoding circuitry needed to pick specific ferroelectric memory cells for reading and writing. The ferroelectric memory cells are typically constructed after the CMOS circuitry has been constructed on pads adjacent to the CMOS isolation transistors. However, memories in which the ferroelectric memory cells are constructed over the CMOS isolation transistors have also been described. In both cases, an isolation layer such as silicon dioxide is first deposited over the CMOS structures.

After the ferroelectric memory cells have been constructed over the CMOS circuitry, a number of further processing steps are needed to complete the memory. Three of these are common to all types of memories. First, various connections between the ferroelectric memory cells and the underlying CMOS circuitry must be made by depositing a conductor such as aluminum. Second, the entire circuit is then covered with a passivation layer such as silicon dioxide or silicon nitride, depending on the type of packaging used to protect the final device. The passivated wafer is then subjected to a forming gas anneal in which it is heated to 350 to 450° C. in a hydrogen/nitrogen atmosphere. Third, the memory cells are packaged in plastic packages. This process also involves the heating of the memory cells in the presence of hydrogen, since the plastic packaging materials emit hydrogen gas during the package forming process.

While satisfactory devices can be demonstrated up to the completion of these last three steps, something in these steps leads to deterioration in device performance. After the forming gas anneal, capacitor based devices exhibit unacceptable imprint problems and poor hysteresis curves. Similarly, ferroelectric FET based devices exhibit poor hysteresis curves and poor data retention. In the case of strontium barium titanate based ferroelectric devices, the crystal structure of the ferroelectric layer is actually destroyed.

Even if the damage done the devices by the forming gas anneal is cured as described below, the process of packaging results in devices having the above-described problems.

Broadly, it is the object of the present invention to provide an improved ferroelectric memory cell.

It is a further object of the present invention to provide a ferroelectric memory cell that still operates satisfactorily after being subjected to subsequent processing steps including a forming gas anneal and plastic packaging.

These and other objects of the present invention will become apparent to those skilled in the art from the following detailed description of the invention and the accompanying drawings.

SUMMARY OF THE INVENTION

The present invention is a ferroelectric memory cell for storing information and a method for fabricating the same. The information is stored in the remnant polarization of a ferroelectric dielectric layer by setting the direction of the remnant polarization. The ferroelectric memory cell is designed to store the information at a temperature less than a first temperature. During the fabrication process, the memory cell is subjected to an annealing operation in the presence of hydrogen at a second temperature and a packaging operation at a third temperature. The memory cell includes top and bottom contacts that sandwich the dielectric layer which includes a ferroelectric material having a Curie point greater than the first temperature and less than the second and third temperatures. The dielectric layer is encapsulated in an oxygen impermeable material such that the encapsulating layer prevents oxygen from entering or leaving the dielectric layer. The memory also includes a hydrogen barrier layer that inhibits the flow of hydrogen to the top and bottom electrodes when the memory cell is placed in a gaseous environment containing hydrogen. In one embodiment of the invention, a hydrogen-absorbing layer is constructed from a ferroelectric material having a Curie point of less than the second temperature but greater than the third temperature. An annealing operation at a temperature above the second and third temperature is utilized to reverse the damage resulting from the annealing operation in the presence of oxygen.

DETAILED DESCRIPTION OF THE INVENTION

Figure 1:
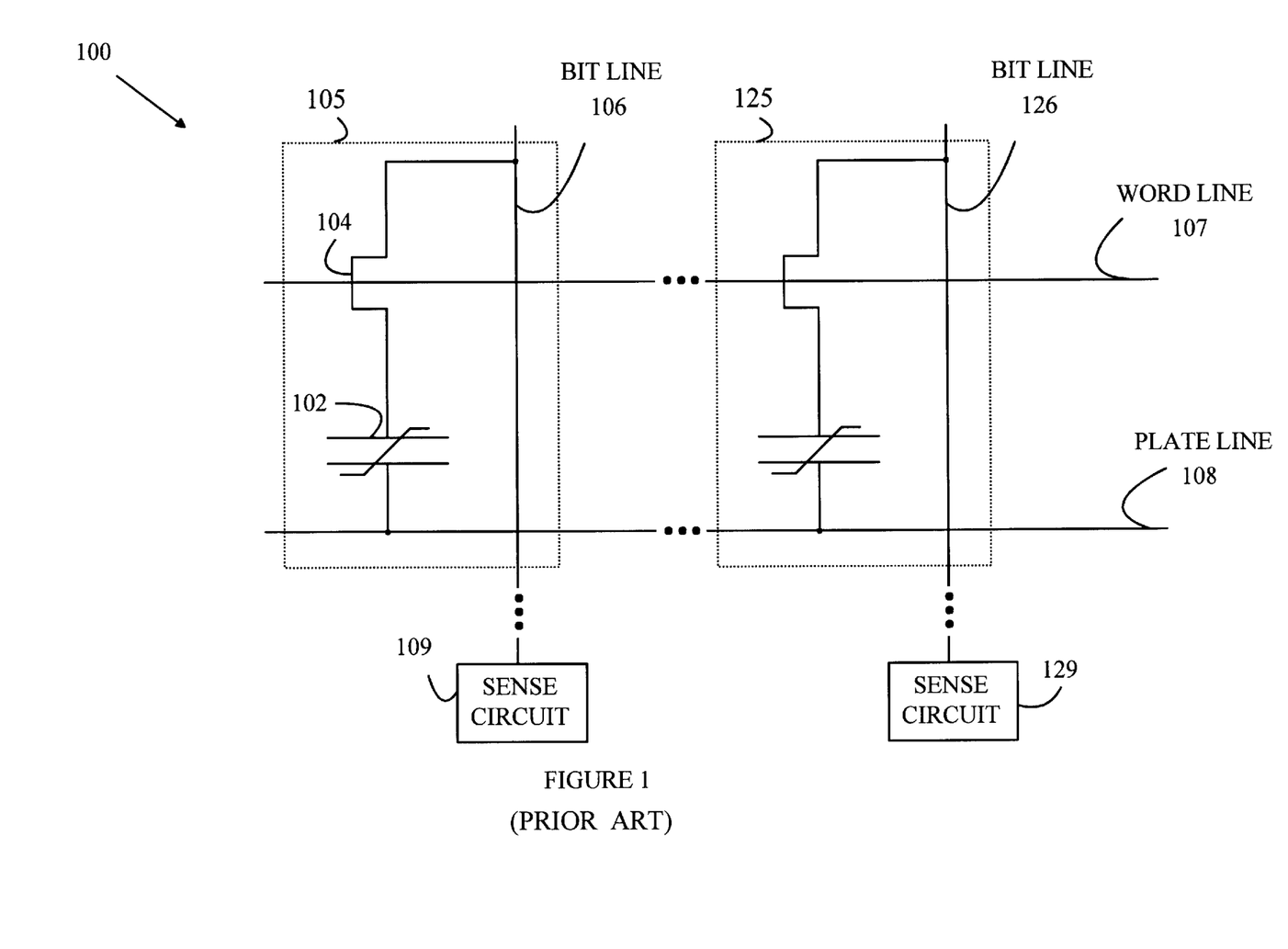
FIG. 1 is a schematic drawing of a memory cell utilizing a ferroelectric capacitor.

A one bit memory cell in a larger memory typically includes an isolation transistor and a ferroelectric memory cell. As noted above, the ferroelectric memory cell may be based on a capacitor or a ferroelectric FET. Refer now to FIG. 1, which is a schematic drawing of a word of memory in a memory system, based on ferroelectric capacitors. Word 100 includes a plurality of one-bit cells of which cells 105 and 125 are typical. Each one bit memory cell includes a ferroelectric capacitor 102 combined with a transistor 104. The ferroelectric material of the capacitor has an electrically reversible remnant polarization. When reversed, a large compensating electrical charge must flow between the two plates of the capacitor. Transistor 104 acts as a switch that connects capacitor 102 to a bit line of which bit lines 106 and 126 are typical. This connection is made in response to a signal on word line 107. A sensing circuit associated with each of the bit lines measures the flow of charge into capacitor 102. A typical sense circuit is shown at 109 and 129.

To execute a write, the word line is activated to turn on transistor 104, bit line 106 is set high or low, and then the plate line 108 is pulsed. The direction of polarization of the capacitor is set by the state of bit line 106.

To execute a read, transistor 104 is turned on, and plate line 108 is pulsed. The charge on the capacitor is forced onto bit line 106 where it is measured by sense circuit 109. If the capacitor polarization is switched by the read pulse, a current will flow on bit line 106. If, on the other hand, the polarization of capacitor 102 is already oriented in the direction provided by the read pulse, only a small current will flow on bit line 106. In either case, the polarization will be pointing in the direction specified by the read pulse after the read operation, independent of the original direction of polarization of capacitor 102. If the data was destroyed by the read operation, sense circuit 109 re-writes the correct data after the read operation.

Figure 2:
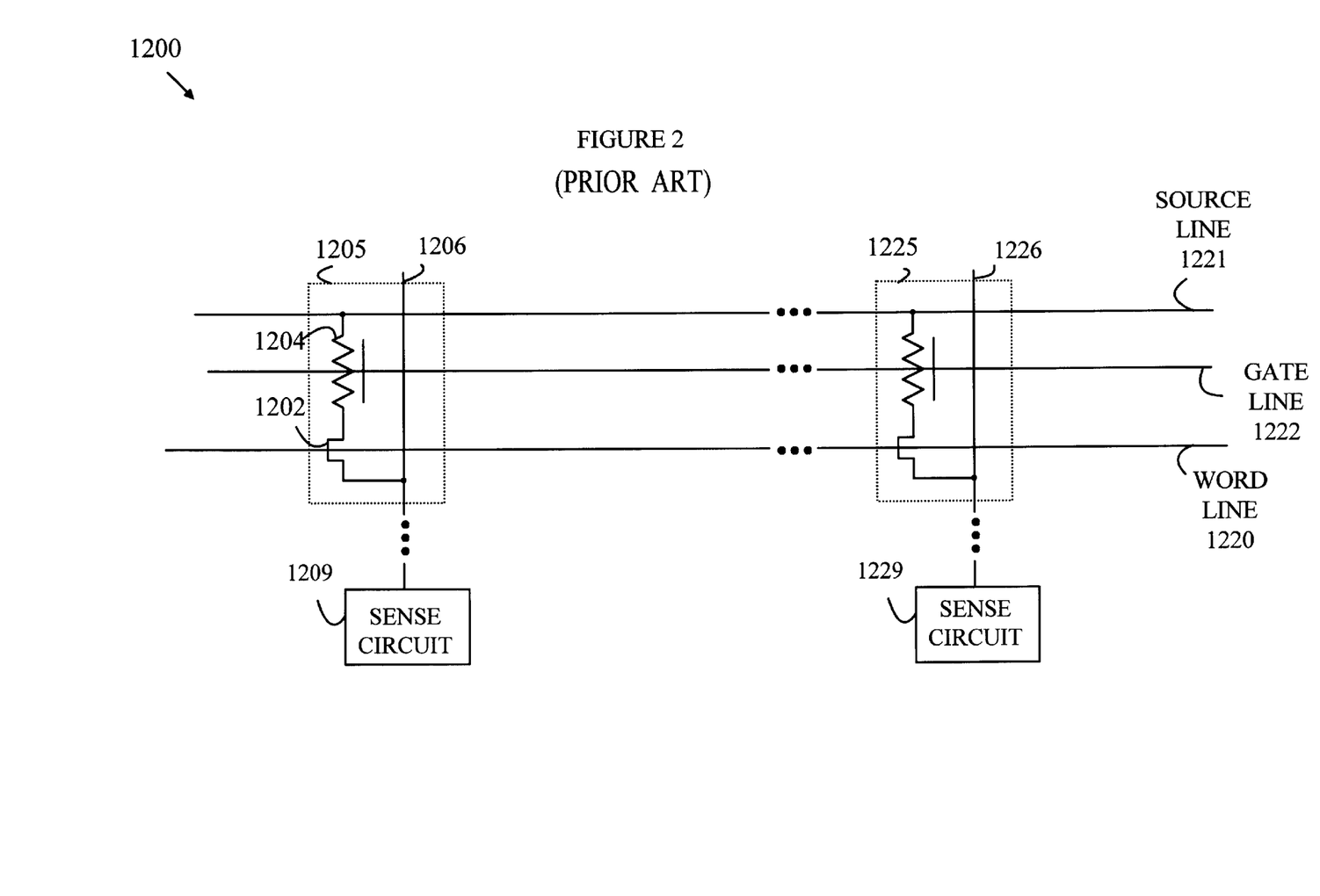
FIG. 2 is a schematic drawing of a word of memory, which utilizes ferroelectric FETs to store the data.

Memories based on ferroelectric FETs are somewhat more complicated in that a number of different single word memory architectures are possible. However, all of these architectures include a ferroelectric FET that is connected to a pass transistor. Refer now to FIG. 2 which is a schematic drawing of a word 1200 of memory which utilizes ferroelectric FETs to store the data. Each bit in word 1200 includes a ferroelectric FET. Each bit is stored in a one bit memory cell of which one bit memory cells 1205 and 1225 are typical. Each one bit memory cell couples a source line 1221 to a bit line. The bit lines for one bit memory cells 1205 and 1225 are shown at 1206 and 1226, respectively. Each one bit memory cell includes a ferroelectric FET 1204 and a pass transistor 1202 which connects ferroelectric FET 1204 between source line 1221 and the corresponding bit line. The resistance of each selected ferroelectric FET 1204 is measured by a sense circuit. The sense circuit corresponding to bit lines 1206 and 1226 are shown at 1209 and 1229, respectively. The pass transistors are controlled via a word line 1220. The manner in which data is read into the ferroelectric FETs depends on the specific architecture being utilized. For the purposes of the present discussion, it is sufficient to note that the polarization of the ferroelectric dielectric may be switched by applying appropriate signals to source line 1221 and gate line 1222 in conjunction with a signal on word line 1220.

Figure 3:
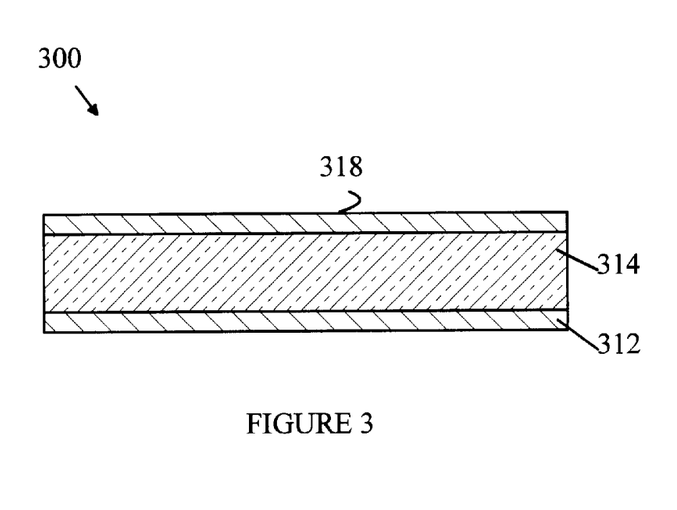
FIG. 3 is a cross-sectional view of a ferroelectric capacitor.
Figure 4:
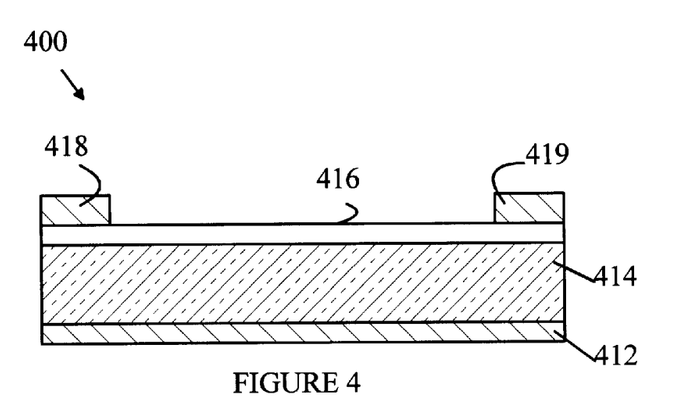
FIG. 4 is a cross-sectional view of a ferroelectric FET.

A cross-sectional view of a typical ferroelectric capacitor is shown in FIG. 3 at 300. Capacitor 300 includes a bottom electrode 312, a ferroelectric dielectric layer 314 and a top electrode 318. For comparison, a cross-sectional view of a typical ferroelectric FET is shown in FIG. 4 at 400. Ferroelectric FET 400 also includes a bottom electrode shown at 412 and a ferroelectric dielectric layer shown at 414. A semiconductor layer 416 is deposited over the ferroelectric dielectric layer 414. Two electrodes, 418 and 419 are then deposited on semiconductor layer 416. Semiconductor layer 416 may be viewed as a variable resistor whose resistance is modulated by the polarization of ferroelectric dielectric layer 414. The resistance of semiconductor layer 416 may be measured by measuring the current that flows between electrodes 418 and 419 when a potential is applied between these two electrodes. Bottom electrode 412 is analogous to the gate of a conventional FET, and electrodes 418 and 419 are analogous to the drain and source of a conventional FET.

From a comparison of FIGS. 1 and 2 it will be apparent that both types of memories have a number of features in common. Each word of memory is constructed from a plurality of ferroelectric memory cells in which each ferroelectric memory cell is connected to a pass transistor. In both cases, the bottom electrode of each ferroelectric memory cell is connected to a common line and one of the connections on the top of the ferroelectric memory cell is connected to the pass transistor. In the case of a ferroelectric FET-based memory, there is a second connection on the top of the ferroelectric memory cell.

The manner in which the present invention gains its advantages over the prior art may be more easily understood with reference to FIGS. 5–10 which are cross-sectional views of a memory cell 200 at various stages in the fabrication process. Memory cell 200 is based on a ferroelectric capacitor. However, it will be apparent to those skilled in the art from the preceding discussion that the teachings of the present invention may also be applied to a memory cell based on a ferroelectric FET.

Figure 5:
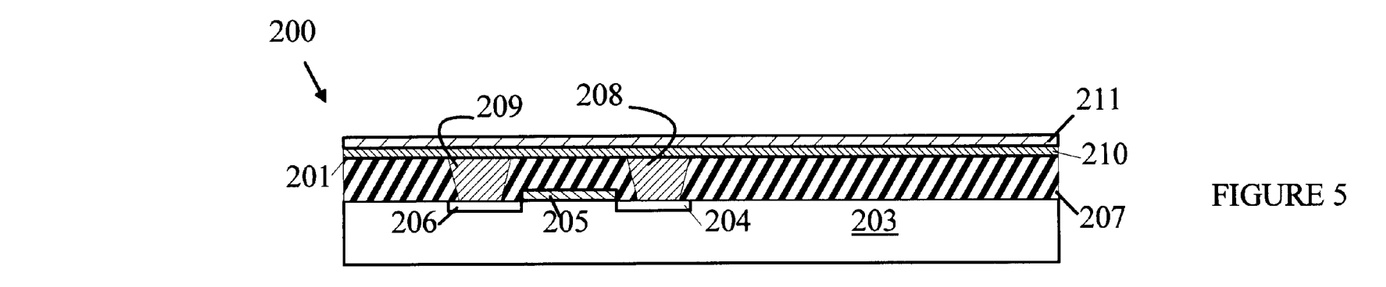
FIGS. 5–10 are cross-sectional views of a memory cell according to the present invention at various stages in the fabrication process.

Refer now to FIG. 5. It is assumed that the isolation transistor has already been fabricated on the silicon substrate 203. The drain, gate, and source of the transistor are shown at 204, 205, and 206, respectively. The transistor has been covered by a layer of $SiO_2$ 207 through which vias have been etched. Contacts 208 and 209 are grown, preferably from polysilicon, in these vias. A platinum layer 210 of approximately 1500 Å is deposited on top of the $SiO_2$ layer 207 and makes electrical contact with contact 208. An approximately 600 Å layer of an ohmic material 211 is then deposited on platinum layer 210. The preferred ohmic contact material is LSCO (lanthanum strontium cobalt oxide). The ohmic contact material reduces fatigue problems. However, embodiments in which the ohmic contact layer is not utilized can also be constructed without deviating from the teachings of the present invention.

In the preferred embodiment of the present invention, a thin layer 201 of titanium or titanium nitride is deposited on the $SiO_2$ layer before depositing the platinum layer. This layer acts as a "glue" for bonding the platinum to the polysilicon and $SiO_2$. In addition, the glue layer prevents the polysilicon and platinum layers from interacting. The glue layer is typically 200 Å. It should be noted that the TiN:Pt layer can be replaced with a Ti:Al alloy in embodiments utilizing the LSCO ohmic contact.

Figure 6:
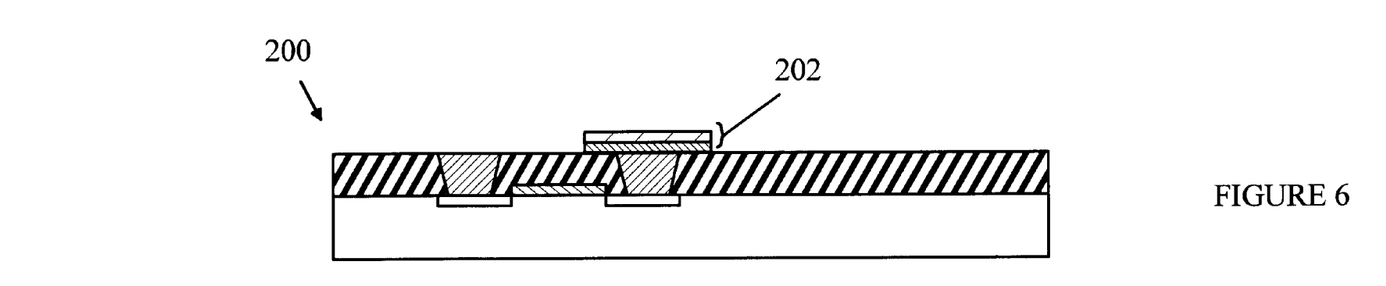
Figure 7:
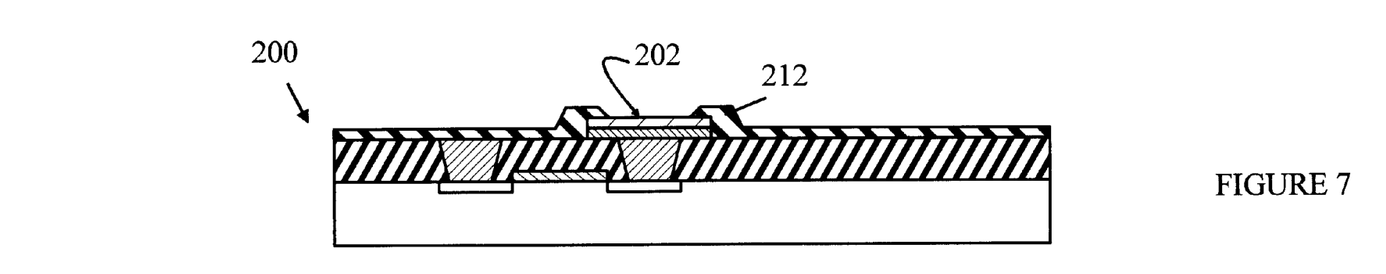

Refer now to FIG. 6. After the above-described layers are deposited, the ohmic contact and platinum layers are etched to form the lower electrode of the capacitor 202. This etching operation is preferably carried out as an ECR Chlorine plasma RIE. A barrier layer 212 of approximately 600 Å is then deposited over the surface of the chip and a window opened over electrode 202 as shown in FIG. 7. The preferred barrier layer is $TiO_2$ that is etched using a $CCl_4$ or $CF_4$ plasma, preferably $CF_4$. The barrier layer is needed to prevent interaction between the ferroelectric layer and the $SiO_2$ around the platinum contact.

Figure 8:
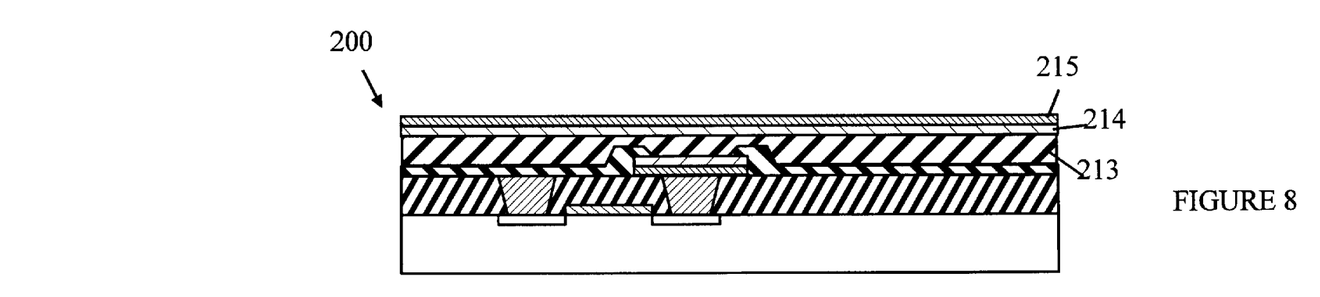
Figure 9:
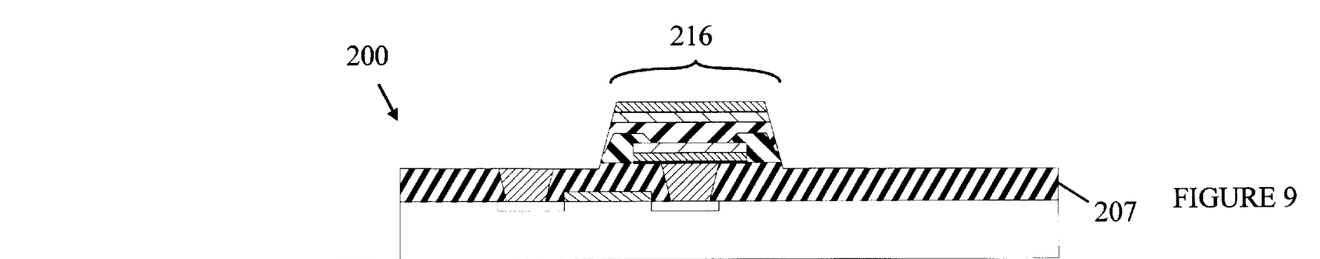

The ferroelectric layer 213 (approximately 1200 Å) and the upper electrode comprising ohmic layer 214 (approximately 600 Å) and platinum layer 215 (approximately 1000 Å) are then deposited as shown in FIG. 8. These layers are then stack etched using an ECR plasma RIE, preferably a combination of Chlorine and Fluorine ions, to provide the capacitor structure shown in FIG. 9 at 216. It should be noted that the stack etch is timed to stop after removing the barrier layer in those regions that do not underlie top electrode 215. The stack etch extends into a portion of the $SiO_2$ layer 207. The end point of the etch may be detected by observing the material removed during the etch, the end point being that point at which Ti is no longer present in the removed material.

Figure 10:
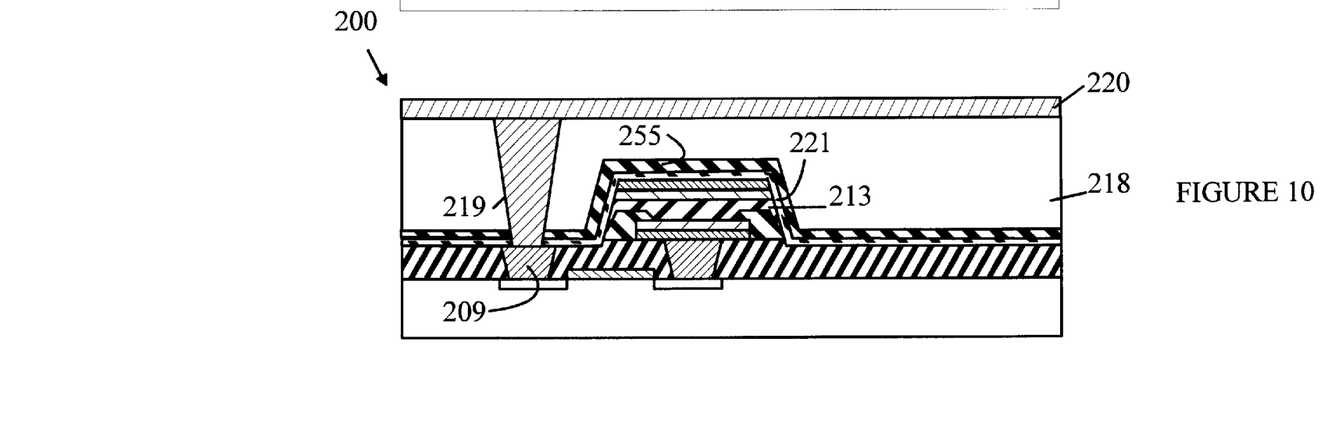

Refer now to FIG. 10. After stack etching the top electrode structure and ferroelectric dielectric layer, a layer 255 (approximately 400 Å) of a hydrogen barrier material and a layer 221 of dielectric material, preferably $TiO_2$, is deposited on the chip.

These layers are then covered with a layer 218 (approximately 2000 Å) of $SiO_2$ and vias opened to the polysilicon contact 209. The via is etched in two steps. First, a $CF_4$ plasma etch is used to remove the $SiO_2$. Then a $CCl_4$ etch is used to remove the $TiO_2$. A polysilicon extension 219 of contact 209 is then grown and the aluminum bit lines 220 deposited. Alternatively, the extension may be constructed by filling the well with aluminum instead of polysilicon. Prior to depositing the aluminum, the wafer may be annealed to recover any damage to the ferroelectric caused by the deposition of the various layers that were deposited after the deposition of the ferroelectric material.

An additional via is opened to the platinum electrode 215 using a $CF_4$ etchant. The location of this via will, in general, depend on the memory architecture, and hence, this via is not shown in FIG. 10. In general, the top electrodes of a number of memory cells are connected together and a single via opened to the common top electrode. In this case, $CF_4$ is the preferred etchant because it etches both the silicon dioxide and titanium oxide layer, but stops on the platinum top electrode and does not damage the PZT layer.

As noted above, the circuit is typically covered with a passivation layer such as silicon dioxide. The passivated wafer is then subjected to a forming gas anneal in which it is heated to 350 to 450° C. in a hydrogen/nitrogen atmosphere. In prior art memory systems, this final step damages the ferroelectric memory cells and renders the memories effectively useless.

The preferred ferroelectric dielectric is based on PZT. The preferred dielectric is lead zirconium titanate that has been doped with a material that has an oxidization state greater than +4. The dielectric is deposited and annealed to form a perovskite structure. The simple perovskite structure is a cubic unit cell. A large cation (A) occupies the corners of the cube, a smaller cation (B) occupies the body center position, and oxygen ions occupy the center of the faces of the unit cell. A generalized chemical formula for this structure is conventionally represented by $ABO_3$. For PZT materials, the A-site is typically occupied by lead, and the B-site is typically occupied by zirconium or titanium. The number of oxygen vacancies has been found to be important to device performance. The use of a dopant having an oxidation state greater than +4 allows the oxygen vacancy effects to be controlled.

The present invention utilizes the observation that damage caused by the forming gas anneal results from two factors. The first factor is a non-uniform charge distribution in the ferroelectric layer that is created by heating the device in a hydrogen atmosphere and from the loss of oxygen from the ferroelectric material. This non-uniform distribution has two sources. First, carriers in the ferroelectric that are not mobile at room temperature are lifted into the conduction bands by the heating associated with the annealing operation. These carriers move under the influence of the local electric fields generated by the domains. Second, any hydrogen ions present are trapped at the negative ends of the domains.

The second source of damage stems from oxygen depletion in the ferroelectric material. At the elevated temperatures associated with the forming gas anneal, the oxygen atoms in the ferroelectric are mobile. The atoms near the surface of the ferroelectric combine with the hydrogen gas from the forming gas anneal. The combined atoms diffuse away from the ferroelectric layer, which is left with an oxygen deficiency.

The non-uniform charge distribution resulting from the movement of slow moving charge carriers such as oxygen vacancies can be removed by heating the ferroelectric to a temperature above its Curie point and cooling the wafer in a time short compared to the mobility of the moving species. At temperatures above the Curie point, the domains and the electric fields created thereby disappear. The accumulated charge then moves under its own electric field and is redistributed uniformly throughout the device. The device is then quickly cooled to prevent the re-introduction of the non-uniform charge distributions when the domains re-form. Hence, in principle, the damage caused by the heating during the forming gas anneal could be reversed by annealing the ferroelectric memory cells at a temperature above the Curie point of the ferroelectric dielectric. Unfortunately, prior art devices have been constructed with ferroelectric layers constructed from materials that have Curie points above 450° C. Hence, the anneal would need to be done at temperatures in excess of 450° C. Such an anneal would damage the aluminum conductors used for the long conduction paths in the circuit. The present invention avoids this limitation by using a ferroelectric layer with a Curie point below the forming gas anneal temperature, i.e., less than 450° C.

While utilizing a low-Curie point ferroelectric relieves the problems created by the slow moving carriers, problems resulting from hydrogen ion entrapment on the domains and oxygen depletion still remain. To prevent the loss of oxygen, the present invention utilizes an oxygen impermeable layer as shown at 221. The preferred material for this layer is $TiO_2$, however, any material that is compatible with the surrounding layers and which blocks the flow of oxygen will provide the desired effect. For example, $Al_2O_3$, yttrium stabilized zirconia(YZT), cerium oxide, strontium titanate ($SrTiO_3$), hafnium oxide, strontium oxide, and diamond may also be utilized.

The oxygen impermeable barrier, however, does not relieve the problems associated with hydrogen ions. Hydrogen ions move rapidly within the ferroelectric layer even at room temperature. Hence, these ions cannot be redistributed by rapid cooling of the layer from a temperature above the Curie point to room temperature. The present invention utilizes a combination of a barrier for hydrogen molecules and a hydrogen getter for hydrogen ions to reduce the problems caused by exposure to hydrogen. The hydrogen ions are generated by the breakdown of $H_2$ on the platinum electrodes, primarily the top electrode.

The goal of the hydrogen barrier is to prevent the hydrogen gas from reaching the platinum electrodes. By surrounding the device with a hydrogen barrier material, the amount of hydrogen that reaches the platinum electrode can be significantly reduced. Such a barrier layer is shown at 255 in FIG. 10. Unfortunately, a via must be opened at some point on the top electrode to provide electrical connection to the top electrode. The via is filled with aluminum or some other conductor that is permeable to hydrogen gas. Hence, there will usually be a "leak" in the hydrogen barrier. This leak will lead to the generation of hydrogen ions on the platinum, albeit, at a substantially reduced rate.

The hydrogen ions generated during the forming gas anneal can be removed utilizing a recovery annealing operation. It has been found experimentally, that the damage done during the forming gas anneal can be reversed by heating the memory cells to a temperature above the Curie point in an atmosphere having a low partial pressure of hydrogen. At temperatures above the Curie point, the domains disappear; hence, the hydrogen ions are no longer bound to the ferroelectric material. The freed hydrogen ions diffuse out of the ferroelectric layer. Hence, the damage resulting from the insertion of the hydrogen ions into the ferroelectric material is reversed. The annealing time needed to reverse the damage depends on the concentration of hydrogen in the forming gas. For a 1% hydrogen concentration in the forming gas, the recovery time is approximately 30 minutes. The annealing time increases linearly with hydrogen concentration.

The recovery anneal is preferably performed in an atmosphere lacking hydrogen. However, it will be appreciated that annealing will provide some benefits even if a small amount of hydrogen is present provided the concentration of hydrogen in the annealing atmosphere is sufficiently low to allow a net exchange of hydrogen between the ferroelectric and the annealing atmosphere.

While introducing a recovery annealing step can reverse the damage done by the forming gas anneal, the damage done in packaging cannot be so easily eliminated. As noted above, the most common form of packaging is plastic. These materials emit hydrogen gas in substantial concentrations when heated to the temperature typically utilized in forming packages. Once the package is formed, any attempt to anneal the part will again expose it to hydrogen from the packaging material. Hence, the present invention utilizes an additional hydrogen getter material to absorb the hydrogen ions generated during packaging, and hence, reduce the concentration of ions in the ferroelectric layer. In the preferred embodiment of the present invention, the same material is used both for the hydrogen barrier and the hydrogen getter. For example, the barrier layer can be constructed from PZT having a Curie point below that of the temperature at which the forming gas recovery anneal is carried out but above the maximum temperature utilized in packaging. The domains in the barrier layer trap hydrogen ions in the same manner as the domains in the ferroelectric layer of the device. At the forming gas recovery anneal temperature, there will be no domains in the ferroelectric dielectric layer, and hence, the getter layer will also be emptied of any hydrogen ions by the forming gas recovery anneal. If the temperature of the packaging is held to a temperature below the Curie point of the getter layer, the getter will absorb the hydrogen ions generated during packaging, and hence, reduce any damage to the working ferroelectric layer.

In the preferred embodiment of the present invention, the hydrogen getter layer is deposited adjacent to the ferroelectric dielectric layer in the capacitor or ferroelectric FET. This provides the maximum surface area in contact with the dielectric layer, and hence, the minimum resistance to the flow of hydrogen ions from the dielectric layer into the getter. In addition, hydrogen ions generated on the top surface of the platinum electrode are closer to the getter layer than the dielectric layer. Finally, the $TiO_2$ layer isolates the getter layer from the $SiO_2$ inter layer dielectric, and hence, prevents problems associated with material incompatibilies between the getter material and $SiO_2$. For example, PZT cannot be placed adjacent to $SiO_2$ because of oxygen migration between the $SiO_2$ and the PZT.

As noted above, any time the device is heated to a temperature that is sufficient to lift carriers into the conduction band, non-uniform charge distributions are introduced into the ferroelectric layer used to store the information. The conventional packaging operation subjects the device to temperatures of typically 400° C., and hence, also creates non-uniform charge distributions in the ferroelectric layer. However, these charge distributions can be avoided if the Curie point of the ferroelectric layer is less than the packaging temperature, since the domains that provide the electric fields that cause the non-uniform distribution are absent above the Curie point. Accordingly, the preferred embodiment of the present invention utilizes a ferroelectric layer for storing the information that has a Curie point that is also less than the peak temperature to which the device is heated during packaging. This reduces the non-uniform charges resulting from the final heating step in the fabrication process. The relationship of these various temperatures may be summarized as follows:

$T_{forming\ gas} > T_{curie(getter)} > T_{packaging} > T_{Curie(memory\ ferroelectric)}$ In the preferred embodiment of the present invention, these four temperatures are 450° C., 425° C., 400° C., and 380° C., respectively.

While the preferred hydrogen barrier material is PZT, many other hydrogen barrier materials may be utilized. For example, any material having a perovskite structure will block the passage of $H_2$ gas.

In addition, the functions of the hydrogen barrier and the hydrogen getter can be separated into individual separate layers. Furthermore, if the leakage rate through the vias is sufficiently low, the hydrogen getter can be eliminated.

It should be noted that there is a lower bound to the Curie point that may be utilized in the working ferroelectric layer. Memory devices store information in the remnant polarization of the ferroelectric. Typically, a polarization in one direction is used to store a "0", and a polarization in the other direction is used to store a "1". If the operating temperature of the device is too near the Curie point, information will be lost, since the remnant polarization also disappears at the Curie point. In this regard, it is important to note that there is a statistical distribution of domains in most ferroelectric compositions. Hence, some of the domains will be lost before the temperature reaches the Curie point. As a result, the present invention utilizes a ferroelectric with a Curie point, which is preferably, at least 150° C. above the operating temperature of the memory. In general, the highest Curie point consistent with a recovery anneal which can be carried out at 450° C. for 15 minutes or 400° C. for 30 minutes is preferred.

Table I lists a number of different PLZT compositions and the Curie points of the resulting dielectrics. Here, a composition of x/y/z means that the ferroelectric has x% lead in the A site, and the remaining A sites are filed with La. The B sites have y% Zr and z% Ti.

TABLE I

| Composition | Curie Point (° C.) |
|---|---|
| 8/20/80 | ~300 |
| 8/40/60 | 240 |
| 12/40/60 | 140 |
| 0/65/35 | 370 |
| 2/65/35 | 320 |
| 6/65/35 | 190 |
| 7/65/35 | 155 |
| 8/65/35 | 110 |
| 1/45/55 | ~380 |
| 4/30/70 | ~380 |

It should be noted that the dopants with oxidation states greater than +4 also depress the Curie point of the PZT. Hence, a low Curie point ferroelectric constructed from PZT having such a dopant provides a dual benefit. For example, PZT doped with 1% to 4% Nb provides a Curie point in the 300° C. to 380° C. range. Similarly, PZT doped with tungsten in the 0.5% to 2% range may also be utilized.

As noted above, annealing above the Curie point alone will not cure the defects caused by the exchange of oxygen between the ferroelectric layer and the forming anneal gas mixture. The present invention overcomes this problem by encapsulating the ferroelectric layer in an oxygen impermeable barrier material. In the preferred embodiment of the present invention the oxygen barrier material is $TiO_2$. Such an encapsulating layer is shown at 221 in FIG. 10. The encapsulation prevents oxygen exchange, and hence, prevents the damage caused by the forming gas anneal.

The hydrogen barrier can likewise be deposited as an encapsulating layer by depositing a layer of the hydrogen barrier material on top of layer 207 shown in FIG. 5 prior to opening vias for the connections to the underlying transistors.

While the above description has utilized drawings, which refer to the fabrication of a capacitor, it will be appreciated that the teachings of the present invention may be equally applied to ferroelectric memory cells based on ferroelectric FETs. Structurally, the ferroelectric FET replaces the top electrode with a semiconductor layer with two electrodes. Hence, a second connection must be made to the top electrode. However, the use of the encapsulating oxygen barrier and hydrogen barrier together with a low Curie point ferroelectric is just as important in ferroelectric FET based devices, as these devices suffer from damage resulting from the forming gas anneal. The damage results from changes in the ferroelectric layer, and hence, the structure of the top electrode has little effect on the damage.

The above-described embodiments of the present invention have utilized specific forms of electrodes. However, it will be appreciated that the advantages of the present invention are independent of the type of electrode structure utilized It should be noted that in the case of a ferroelectric FET, the preferred semiconductors for the "top electrode" are also oxides whose conductivity is determined by the concentration of oxygen vacancies. The encapsulation of the device in an oxygen impermeable barrier also protects this semiconductor layer from changes in the oxygen vacancy concentration during annealing operations performed after the deposition of the semiconductor layer.

While the above described embodiments of the present invention have utilized primarily PZT based ferroelectrics, it will be apparent to those skilled in the art that the teachings of the present invention may also be applied to other ferroelectric materials such as strontium bismuth tantalite.

The preferred embodiment of the present invention utilizes an encapsulating layer that prevents oxygen from entering or leaving the dielectric layer. However, it will be obvious to those skilled in the art from the preceding discussion that a layer that only inhibits such flow will still provide an improvement over prior art designs. In particular, it should be noted that a small amount of oxygen may bypass the barrier through the via provided to access the top electrode. Small leaks of this form may be tolerated without departing from the teachings of the present invention. Accordingly, an encapsulating layer is defined to include a layer that has vias for making connections to the electrodes.

Various modifications to the present invention will become apparent to those skilled in the art from the foregoing description and accompanying drawings. Accordingly, the present invention is to be limited solely by the scope of the following claims.

What is claimed is:

1. A ferroelectric memory cell for storing information, said memory cell operating to store said information at a temperature less than a first temperature, said memory cell being subjected to an annealing operation in the presence of hydrogen at a second temperature and a packaging operation at a third temperature, said memory cell comprising:

a bottom contact;

a dielectric layer comprising a ferroelectric material having a Curie point greater than said first temperature and less than said third temperature, said ferroelectric material having a remnant polarization below said first temperature, said information being stored by altering said remnant polarization;

a top contact, said dielectric layer being sandwiched between said bottom contact and said top contact;

an encapsulating layer comprising an oxygen impermeable material, said encapsulating layer impeding the flow of oxygen into, or out of, said dielectric layer; and a hydrogen barrier layer, said hydrogen barrier layer impeding the flow of hydrogen to said top contact when said memory cell is placed in a gaseous environment including hydrogen, said hydrogen barrier comprising a ferroelectric material having a Curie point less than said second temperature but greater than said third temperature.

2. The memory cell of claim 1 wherein said hydrogen barrier layer comprises a perovskite.

3. The memory cell of claim 1 wherein said hydrogen barrier layer comprises a layer in contact with said top contact and said dielectric layer.

4. The memory cell of claim 1 wherein said ferroelectric material of said hydrogen barrier comprises PZT.

5. The memory cell of claim 1 wherein said hydrogen barrier layer comprises a layer within said encapsulating layer.

6. The ferroelectric memory cell of claim 1 wherein said top contact comprises a semiconducting layer and first and second top electrodes, said first and second top electrodes being spaced apart on said semiconducting layer.

7. The ferroelectric memory cell of claim 1 wherein said oxygen impermeable material comprises a material chosen from the group consisting of $TiO2$, $Al_2O_3$, yttrium stabilized zirconia(YZT), cerium oxide, strontium titanate ($SrTiO_3$), hafnium oxide, strontium oxide, and diamond.

8. The ferroelectric memory cell of claim 1 wherein said ferroelectric material of said dielectric layer is doped with an element having an oxidation state greater than +4.

9. The ferroelectric memory cell of claim 8 wherein said doping element is chosen from the group consisting of Nb, Ta, and W.

10. The ferroelectric memory cell of claim 8 wherein said doping element is present in a concentration of between 1% and 8%.

* * * * *